(12) United States Patent
Wilson et al.

(10) Patent No.: US 7,038,513 B2
(45) Date of Patent: May 2, 2006

(54) CLOSED-LOOP INDEPENDENT DLL-CONTROLLED RISE/FALL TIME CONTROL CIRCUIT

(75) Inventors: Timothy M. Wilson, Aloha, OR (US); Michael C. Rifani, Portland, OR (US); Songmin Kim, Beaverton, OR (US); Greg Taylor, Portland, OR (US); Navindra Navaratnam, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 10/878,033

(22) Filed: Jun. 29, 2004

(65) Prior Publication Data

US 2005/0285648 A1    Dec. 29, 2005

Related U.S. Application Data

(63) Continuation-in-part of application No. 10/877,991, filed on Jun. 29, 2004.

(51) Int. Cl.
*H03K 5/12* (2006.01)
(52) U.S. Cl. .................................... 327/170; 327/112
(58) Field of Classification Search ............... 327/170, 327/108, 109, 112
See application file for complete search history.

(56) References Cited

U.S. PATENT DOCUMENTS

| | | | | |
|---|---|---|---|---|
| 4,567,378 A | * | 1/1986 | Raver | 326/27 |
| 5,459,422 A | * | 10/1995 | Behrin | 327/276 |
| 5,764,091 A | * | 6/1998 | Sumita et al. | 327/175 |
| 6,300,806 B1 | * | 10/2001 | Theus et al. | 327/112 |
| 6,362,672 B1 | * | 3/2002 | Geist | 327/170 |
| 6,777,974 B1 | * | 8/2004 | Eichfeld et al. | 326/26 |
| 6,836,168 B1 | * | 12/2004 | Lesea et al. | 327/170 |
| 6,906,567 B1 | * | 6/2005 | Culler | 327/170 |

* cited by examiner

Primary Examiner—Kenneth B. Wells
Assistant Examiner—Hai L. Nguyen
(74) Attorney, Agent, or Firm—Fleshner & Kim LLP

(57) ABSTRACT

A system and method for processing signals determines rise and fall times of a driving signal, compares the rise and fall times to desired values, and independently controls the rise and fall times to equal the desired values. The rise and fall times may be controlled by generating one or more first correction bits based on a difference between the rise time and a corresponding one of the desired values, generating one or more second correction bits based on a difference between the fall time and a corresponding one of the desired values, and then separately applying the bits to independently control the rise and fall times of the driving signal. The driving signal may be an I/O signal or another type of signal.

34 Claims, 10 Drawing Sheets

CLOSED-LOOP INDEPENDENT DLL-CONTROLLED RISE/FALL TIME CONTROL CIRCUIT

CROSS-REFERENCE TO RELATED APPLICATIONS

This application is a continuation-in-part of U.S. patent application Ser. No. 10/877,991 filed on Jun. 29, 2004, the contents of which are incorporated herein by reference.

FIELD

This invention relates to control circuits and methods for generating timing signals.

BACKGROUND OF THE INVENTION

The rise/fall time of signals traveling between a CPU and chipset will often vary because of one or more external influences. These influences include variations in silicon strength caused by process, voltage and/or temperature conditions that exist across large numbers of dies. Uncompensated-for changes in supply voltage also contribute to rise/fall time variations. If left unaddressed, these variations will adversely affect system performance. For example, if the rise/fall time is too slow, timing failures are likely to occur. Conversely, if the rise/fall time is too fast, signal integrity and reliability problems may arise because of large reflections and over/undershoot effects.

Various methods have been proposed for controlling the rise/fall times of I/O driving signals on the motherboard of a computer. One method involves matching the strength of a pre-driver circuit against a predetermined DC resistance. This requires manipulating the resistance portion of an RC delay between the pre-driver and a driver circuit in a Gunning transistor logic (GTL) buffer. Through these manipulations, the turn-on and turn-off rates of the driver can be adjusted, to thereby control I/O rise/fall times.

Another method involves performing on-die termination compensation. According to this method, Rtt compensation bits are used to access a look-up table of slew-rate compensation bits. This table is usually included in a ROM preprogrammed with slew-rate compensation bit settings that correspond to desired pre-driver strengths based on the strength of the Rtt.

The methods described above suffer from a number of drawbacks. For example, both methods take an indirect approach to controlling rise/fall times that is considered to be slow and inefficient. More specifically, in both methods the resistance required to achieve a constant rise/fall time varies across process, voltage, and temperature corners, and the driver of the GTL buffer is compensated so the capacitance portion of the RC delay varies. Also, in both methods the circuit structure used for compensation differs significantly from the pre-driver structure being compensated. This can lead to poor edge rates, even in cases where the compensation circuit works properly.

DESCRIPTION OF THE PREFERRED EMBODIMENTS

Figure 1:
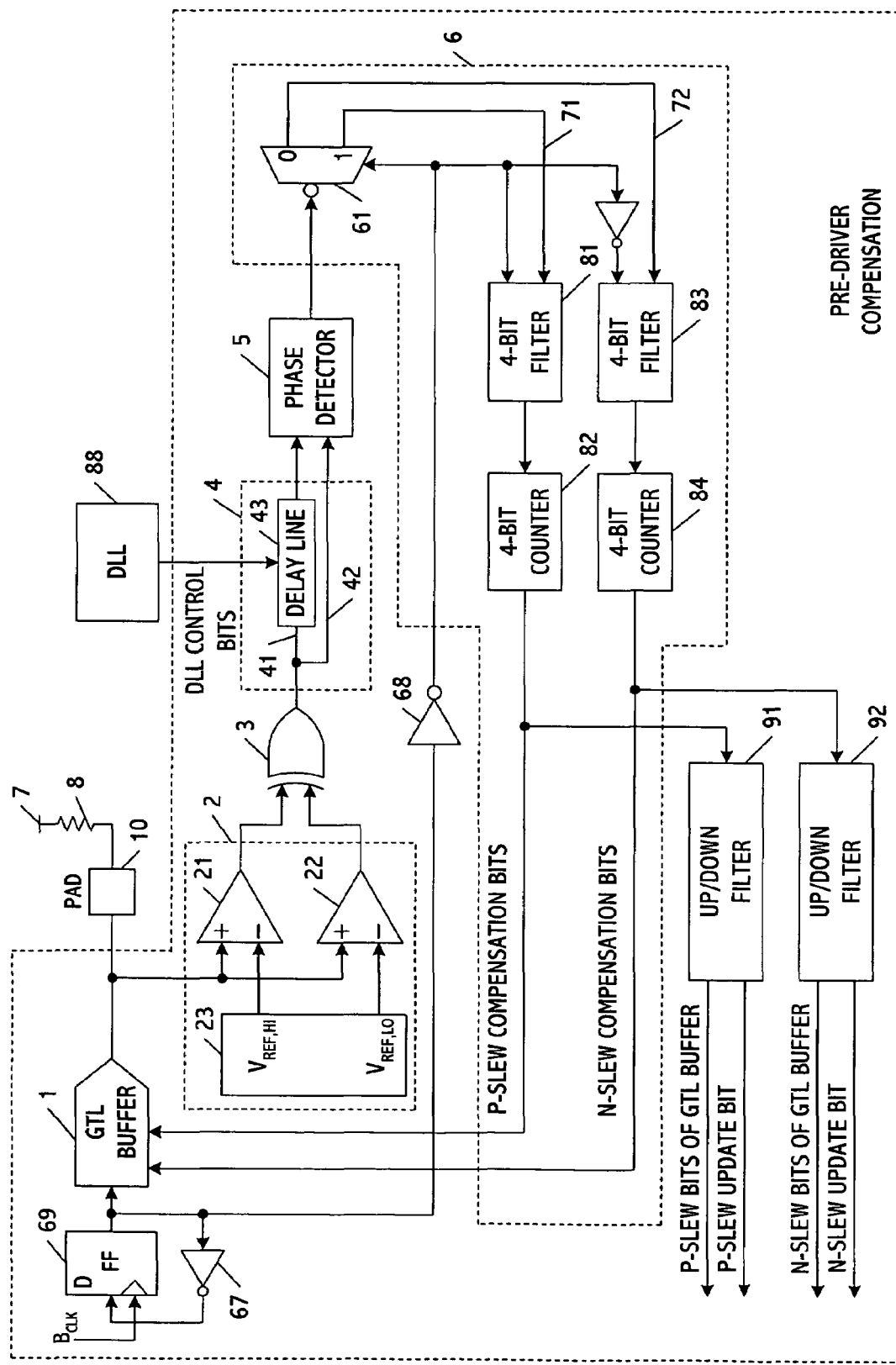
FIG. 1 is a diagram showing a circuit for controlling the rise and/or fall time of driving signals in accordance with one embodiment of the present invention.

FIG. 1 shows a circuit for controlling the rise and/or fall time of driving signals in accordance with one embodiment of the present invention. The driving signals may be any type including but not limited to I/O signals traveling between a CPU and chipset on the motherboard of a computer or other processing system, or ones traveling along chipset/DRAM connections. While the embodiments described herein are ideal for use in controlling high-speed I/O signals, other embodiments may control the rise/fall times of moderately fast signals such as those operating in association with JTAG/ITP ports.

The control circuit includes a dummy buffer 1, a sampling circuit 2, a logic gate 3, a delay circuit 4, a phase detector 5, and a feedback circuit 6 coupled to the dummy buffer. The dummy buffer generates signals for calibrating the rise/fall times at a signal pad 10, which, for example, may be connected to a power supply 7 through, for example, a resistor 8. The power supply may be located on the motherboard or elsewhere. The dummy buffer is preferably an exact replica of the one or more GTL buffers requiring controlled edge rates for their communication internally with external circuits.

The sampling circuit preferably includes two sense amplifiers 21 and 22, which sample the signal input into the pad at predetermined voltage points. This may be accomplished, for example, by comparing the input signal at the non-inverting terminal of the amplifiers to reference voltages, $V_{REF,80}$ and $V_{REF,20}$, input into the inverting terminals. The reference voltages may be output from a signal generator 23 included in the sampling circuit. The sense amplifiers therefore effectively function as comparator circuits for sampling the input signal waveform into the pad at specific points.

The logic circuit preferably includes an XOR gate which generates a logical one when the outputs of the sense amplifiers are different logical values. Alternative implementations may use a mask (e.g., an AND gate with one inverted input) to control a single edge, or a pair of mask gates and delay lines to separately control both edges.

The delay circuit shifts the time pulse output from the XOR gate. The delay circuit contains a first signal path 41 and a second signal path 42. The first signal path includes a delay line 43 which generates one or more control bits for delaying the output of the logic gate by a predetermined time. This time may be programmed by a control circuit (such as a delay-locked loop (DLL) 88), which sets the delay to a value that corresponds to an intended rise/fall time at the pad. The second signal path carries the output of the logic gate preferably without delay.

The phase detector compares the phases of the time pulse from the delay line and the un-delayed time pulse along path 42. If the duration of the time pulse is longer than the programmed delay of the delay line, the detector will output a first signal. Conversely, if the duration of the time pulse is shorter than the programmed delay, a second signal is produced. The phase detector may take any one of a variety of forms including but not limited to a master-slave flip-flop.

The manner in which the foregoing elements cooperate to generate a time pulse (e.g., a square wave) will now be described in greater detail. When the pad output signal rises, the two sense amplifiers transition at different points in the output waveform. Both amplifiers output a low level when the pad output signal is below the trip point of both sense amplifiers, and a high level when the pad output signal is above the trip point of both sense amps. The amplifier outputs differ when the pad output is between the trip points. The XOR gate converts the two sense amplifier outputs into a signal that indicates when the pad output signal is between the trip points of the amplifiers, or equivalently it generates a high pulse for a time equal to the time that the pad output signal is between the two sense amplifier trip points. One example of these trip points may be 20% and 80% of the waveform transition.

Given these illustrative values, during steady state the two sense amplifiers will output the same value. This will cause the XOR output to be '0.' When a transition at the pad occurs, it will cross the 20% and 80% reference points of the sense amplifiers at different times, and one of the amplifiers will trip before the other. This will cause the two inputs to the XOR gate to be different, and will drive a '1' out of the XOR gate for the duration that the two amplifier outputs are different. When the pad transition crosses the other reference point, the amplifier outputs will again be the same, and the XOR will again output '0.' The result will be a high pulse out of the XOR gate, and the width of that pulse will be equivalent to the time that the pad voltage spent between the two reference values of the sense amplifiers. Useful information is stored in the width of the pulse. This correlates to the transition time of the I/O signal at the pad.

The pulse output from the XOR gate is passed through a delay line. The time pulse and its delayed version are then compared in the phase detector. The results of this comparison determine whether the driving signal at the pad has a desired rise/fall time, and if not adjustments are made.

More specifically, the delay circuit is programmed to a predetermined transition time, i.e., an intended time the pad signal should spend between the two sense amplifier reference points. The output of the XOR gate is sent through this delay line. The output of the delay line and the output of the XOR gate are then sent to the phase detector. If the programmed delay through the delay line is less than the length of the XOR gate pulse, this will be reflected as a detectable difference in their phases. The phase detector will then output a first predetermined value, e.g., a '1.' This signal therefore indicates that the actual pad transition time is longer than the programmed time (the pad signal transitioned slower than desired).

On the other hand, if the delay through the delay line is longer than the length of the XOR gate pulse, this will be reflected as a detectable difference in their phases. The phase detector will then output a second predetermined value, e.g., a '0.' This signal indicates that the pad signal transitioned faster than intended.

The phase detector output therefore indicates whether the transition time of the pad output signal is too slow or too -fast, which, in turn, directly corresponds to whether an adjustment is required in one or more of the rise and fall time of the driving signal at the pad. This information is then provided to a "bang-bang" controller that ensures that the rise or fall time is always as close to the reference transition time as possible.

Figure 2:
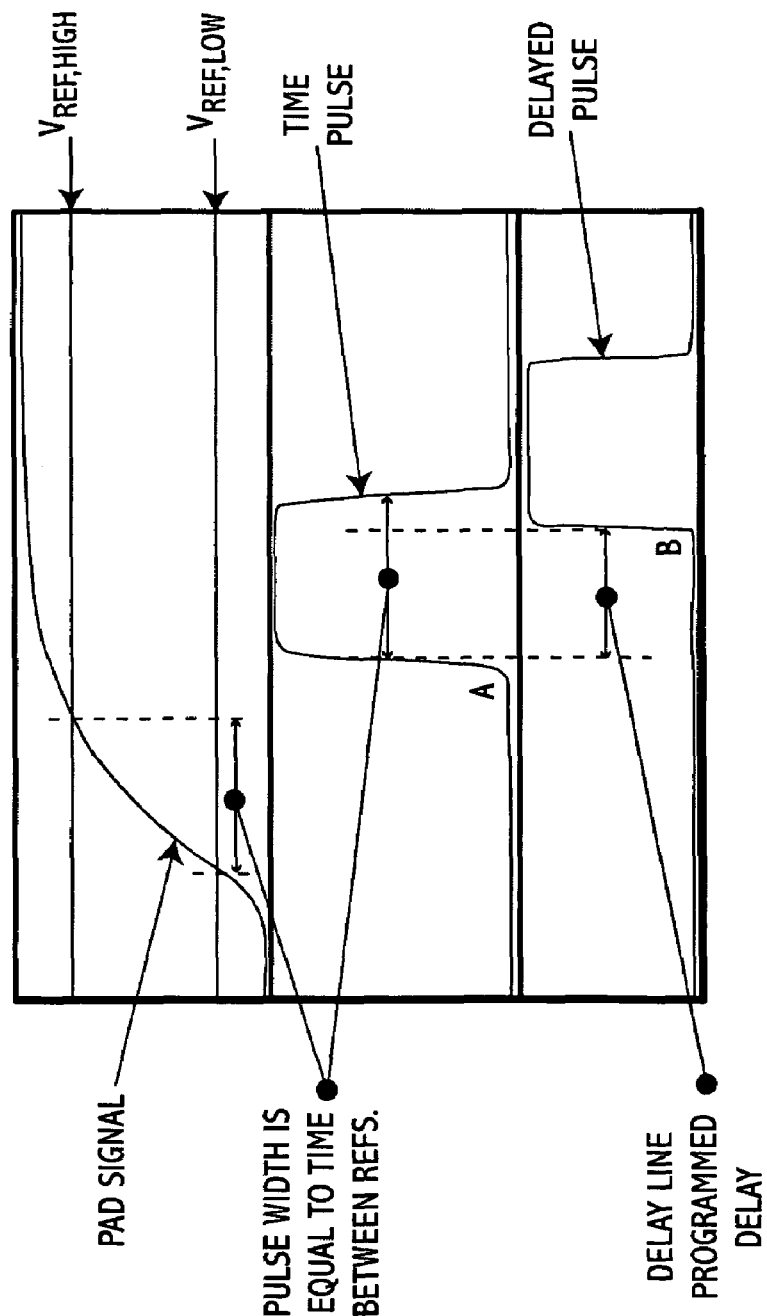
FIG. 2(a) shows an example of a pad signal sampled by the circuit of FIG. 1 at high and low reference voltages, and FIGS. 2(b) and 2(c) respectively show corresponding pulses produced at points specific points in this circuit.

FIGS. 2(*a*)–(*c*) are graphs respectively showing a waveform of the driving signal at the pad, the time pulse output from the XOR gate (A), and the delayed time pulse output from the delay line (B). Time pulses A and B are input into the phase detector. When the phase detector is implemented as a flip-flop, the delayed time pulse B may serve as a clock signal into the flip-flop and the un-delayed time pulse A may serve as an input into the flip-flop.

If the rising edge of the delayed time pulse signal clocks the flip-flop while the un-delayed time pulse signal at the input of the flip-flop is still in the high state, this indicates that the transition time of the driving signal at the pad is longer than the programmed delay in the delay line, and therefore must be decreased. This situation is shown in a comparison of FIGS. 2(*a*) and 2(*b*), where the rising edge of signal B transitions to a high state while the un-delayed time pulse is still in the high state.

If the rising edge of the delayed time pulse signal clocks the flip-flop after the un-delayed signal transitions to a low state, this indicates that the transition time of the driving signal at the pad is shorter than the programmed delay in the delay line, and therefore must be increased. That is, the delay through the delay line was longer than the transition time at the pad and therefore the pad transition was faster than targeted. In this situation, the transition time at the pad must be increased.

The output of the phase detector is connected to a demultiplexer 61, which is controlled by the test signal input into the dummy buffer. This control ensures that rising and falling edges are controlled separately and not confused with one another. In this embodiment, the test signal is passed through an inverter 68 before it is input into the demultiplexer. Also, the test signal is preferably generated based on the output $B_{clk}$ of a clock signal generator. This clock signal may be input into the clock of a D flip-flop 69, whose output is coupled to the dummy buffer. As shown, the D flip-flop output may be fed back to an input terminal of the flip-flop through an inverter 67. Other signal-generation circuits may be used to generate the test signal.

When the selector signal assumes a first value, the demultiplexer passes the phase detector signal to one portion of the feedback circuit. When the selector signal assumes a second value, the demultiplexer passes the phase detector signal to another portion of the feedback circuit. The output values of the demultiplexer control the P-slew and N-slew compensation bits input into the dummy buffer.

The feedback loop of the present embodiment includes first and second signal paths 71 and 72, which are preferably separate from one another. The first signal path may be used, for example, to control the fall time of signals input at the pad and the second signal path may control the rise time of those signals. These separate paths enable the present embodiment to independently control the rise and fall times at the pad to thereby enhance system accuracy and performance.

This independent control is achieved by inputting an appropriate selection signal into the demultiplexer. As previously indicated, the selection signal preferably corresponds to an inverted value of the test signal input into the dummy buffer. The test pulse may be asserted every bus clock or every n bus clocks, where n≧2. If the inverted test signal has a rising edge, the demultiplexer is controlled to pass the phase detector signal along signal path 72. Conversely, if the inverted test signal has a falling edge, the demultiplexer passes the phase detector signal along signal path 71.

Each signal path includes an n-tap filter and an m-bit counter circuit, where n may or may not equal m. For illustrative purposes only, n=m=4 in FIG. 1. More specifically, signal path 71 includes 4-tap filter 81 and 4-bit counter 82 and signal path 72 includes 4-tap filter 83 and 4-bit counter 84.

The 4-tap filter in each signal path removes random noise events that are too fast to compensate for. This may be accomplished by comparing four consecutive signals (which correspond to driving signal edge measurements) output from the phase detector. If all the measurements are the same, the filter generates an output signal which enables a corresponding one of the counters to change its count value. Each 4-tap filter may be enabled by an inverted value of the test signal.

The counter in each signal path increments or decrements its value based on the output of a corresponding one of the filters. While various types of filters may be used, in this embodiment each filter outputs at least two signals. The first signal may be referred to as a 'same' signal, which indicates that the last four measured values are the same. This is accomplished by comparing the four current values stored in the four taps of the filter. A 'same' signal acts as an enable to the counter.

The second signal output may be referred to as an 'up/down signal,' which may correspond to the value actually stored in the filter. This signal is a delayed version of the phase detector output, which signifies whether the pad signal was too fast or two slow in terms of its transition (e.g., rise/fall time). A '1' indicates tells the counter to increment and a '0' tells it to decrement. In order for the counter to increment or decrement its value, both signals are preferably output from the filter, e.g., one to enable the counter and the other to control whether the count value is increased or decreased. Filters which perform these general comparing and value-storing functions are known to those skilled in the art.

Counter 82 generates a digital signal including a predetermined number (n) of P-slew compensation bits, and counter 84 generates a digital signal including a predetermined number (m) of N-slew compensation bits. The P-slew and N-slew compensation bits respectively control the strength of the pull-up and pull-down within the pre-driver. The pre-driver can be viewed as an inverter with multiple legs that can be enabled. The strength of the PMOS devices will control the rising edge of the N-channel (falling edge at the pad) and the strength of the NMOS devices will control the falling edge of the N-channel (rising edge at the pad). This allows independent compensation of the rising and falling transition times at the pad. When the pre-driver has a stronger pull-up, its output rises faster. This results in a faster falling edge on the output of the (inverting) driver.

The compensation bits, thus, adjust the slew rate of the test (or clock signal) input into the dummy buffer to an intended value. The value of n may be the same or different from m.

The target slew rate (measured, for example, in volts/nanosecond) is the difference between the sense amplifier trip points divided by the reference delay. One slew rate which may be used in this embodiment resides rate between 2.5V/ns and 6V/ns. A slew rate that is too fast will cause overshoot and undershoot on the bus. This causes oxide reliability and signal integrity problems, which will cause a platform to not operate correctly. Slew rates that are too slow will cause timing failures. Slew rates with the above values will typically result in around 1V/ns edges at the receiver. If the voltage swing is 1V, that will be a 1 ns transition time. An 800MT bus, for example, has a bit period of 1.25 ns. In this example, a lesser slew rate may be used but, if so, may cause a break in timing.

The slew compensation bits are generated based on the count values stored in counters 82 and 84 respectively. These bits are output continuously, but change each time an output edge is "measured." More specifically, the counters are clocked by the same clock that generates the target signal into the dummy buffer. Once the counters are clocked, the outputs are immediately sent to the dummy buffer in the compensation circuits. However, before being distributed to the GTL buffers on the bus, the count values go through the update filters (91 and 92).

Based on the enable and the output of the demultiplexer and filters, the counters will increment or decrement their count value. The count values (compensation bits) may be passed through the update filters (e.g., digital low-pass filters) before being used by the regular output buffers, in order to avoid having those buffers be subject to the continual "hunting" that takes place in a "bang-bang" controller. The compensation bits therefore correspond to the count values in the counters. The bits that are actually sent to the GTL buffers preferably lag the counters to filter out steady-state toggling.

The count values are controlled based on the output of the demultiplexer. Assuming that a larger count causes the pre-driver to have a greater strength (control of the pre-driver strength is described in greater detail below), the counter increments when four consecutive high values are output from the demultiplexer, resulting in the filter asserting a 'same' signal and outputting a high value on the up/down signal. This occurs when a low signal is output from the phase detector, e.g., when the transition time is too slow.

The counter decrements when four consecutive low values are output from the demultiplexer resulting in the filter asserting a 'same' signal and outputting a low value on the up/down signal. This occurs when a high signal is output from the phase detector, e.g., when the transition time is too fast. In a practical application, the counters may be initialized at start-up to a predetermined value, for example, such as zero or a mid-range value.

The P-slew and N-slew compensation bits are fed into the pre-driver of the dummy buffer, and example of which is discussed below. The pre-driver controls the turn-on and turn-off rate of the pull-down device, which in turn controls the edge rate at the pad. The compensation bits therefore control the strength of the dummy buffer, for example, by enabling or disabling parallel tri-state structures to modulate the pre-driver strength.

The control circuit of the present embodiment also includes an Up/Down filter 91 coupled to the output of counter 82, and an Up/Down filter 92 coupled to the output of counter 84. Filter 91 outputs one or more P-slew compensation bits and P-slew update bits based on the count value output from counter 82. The N-slew bit generator outputs one or more N-slew compensation bits and N-slew update bits based on the count value output from counter 84. As previously indicated, filters 91 and 92 may include digital low-pass filters for preventing hunting effects.

In order to generate their outputs, filters 91 and 92 are fed the same output signal from the demultiplexer. They then compare the last two values of this bit, and if they are the same the filters clock their respective counter outputs and send them to the GTL buffers. If they are not the same, no update will occur.

The compensation bits output from filters 91 and 92 are delayed versions of the dummy buffer bits. In steady-state operation, the compensation machine may toggle between two bit settings. One will be slightly slower than the target, and one slightly faster. To avoid sending this steady-state toggle behavior out to the GTL buffers, the update filter (slew generator) is inserted. The P-slew/N-slew update bits tell the GTL buffers to clock in new values when the compensation unit sends them.

The control circuit therefore directly controls the rise/fall time of the driving signals. In accordance with the present embodiment, this is accomplished by monitoring the rise/fall time at a signal pad, and then controlling pre-driver strength in a GTL I/O buffer to achieve a predetermined time. This strength is controlled using a feedback system, in which pull-up and pull-down strengths of the pre-driver are independently controlled to adjust the fall and rise time of the I/O respectively. The pre-driver strength is varied over different process, voltage, temperature and/or other external influences to achieve the desired rise/fall time. This is preferable over other proposed methods, which use fixed pre-driver strengths with varying rise/fall times across variable conditions.

By controlling rise/fall time in this manner, the maximum bus frequency may advantageously be increased to achieve improved system performance. More specifically, as previously mentioned a trade-off exists between signal integrity and timing margin for purposes of determining edge rates. If they are not compensated and allowed to vary over process, voltage, and temperature, they will negatively affect the maximum operating frequency of the front-side bus. The embodiments of the present invention perform this compensation function to allow the operating frequency of the front-side bus (or any other system in which this control is implemented) to attain a maximum or optimal value. This is further evident as follows.

In an interface application, signals are conveyed from output to input by wiring across a board and the packages containing the integrated circuits. Because the board and packages are manufactured separately, their traces will likely have differences in characteristic impedance. In addition, discontinuities may exist in the interfaces between these media, e.g., the socket into which the CPU is plugged.

The ability of a signal to tolerate these discontinuities is related to its edge rate. Slower edges correspond to longer wavelength signals and are thus less affected by small or short impedance discontinuities in the signal path. The discontinuities can generally be minimized but doing so raises product costs. Cost, therefore, serves as one constraint on achieving the fastest edges possible.

The system requirements also place delay restrictions on the signals, e.g., the signals must travel from driver to receiver in a single clock cycle. A signal that transitions from low to high too slowly will be unable to meet the required system timing. The performance expectations of a product therefore serve as a limitation on the slowest edges that can be used.

Better control of the edge rates produced by a circuit, thus, permits tighter limitations on the edge rate in a system, either enabling faster systems for the same cost or less expensive systems at the same performance. The embodiments of the present invention may be applied to provide this improved control, to thereby achieve these performance enhancements.

Figure 3:
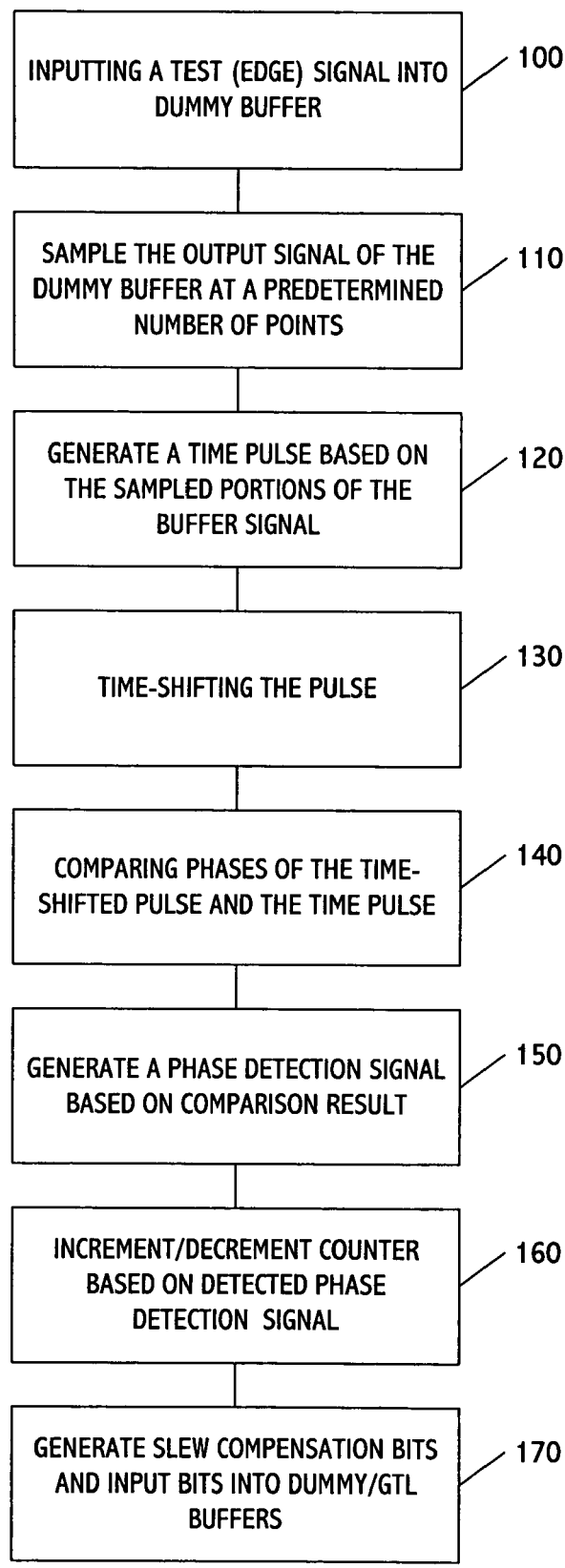
FIG. 3 is a flow diagram of functional blocks included in a method for controlling the rise and/or fall time of driving signals in accordance with an embodiment of the present invention.
Figure 4A:
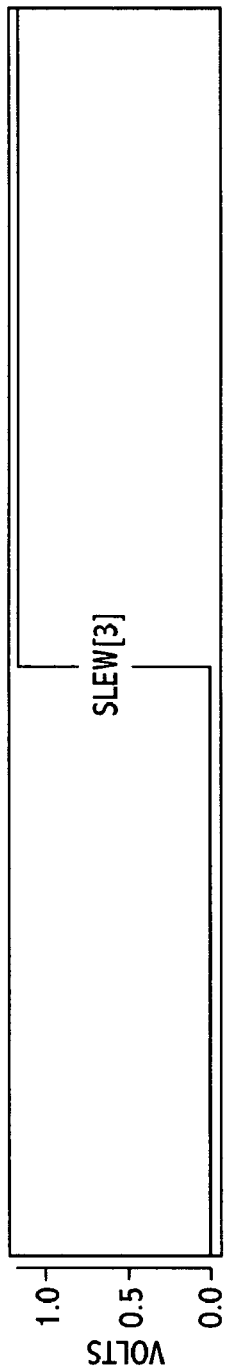
FIGS. 4(a)–(d) are graphs showing examples of outputs of one of the Up/Down counters of the circuit of FIG. 1 used to generate the N-slew compensation bits of the pre-driver.
Figure 4B:
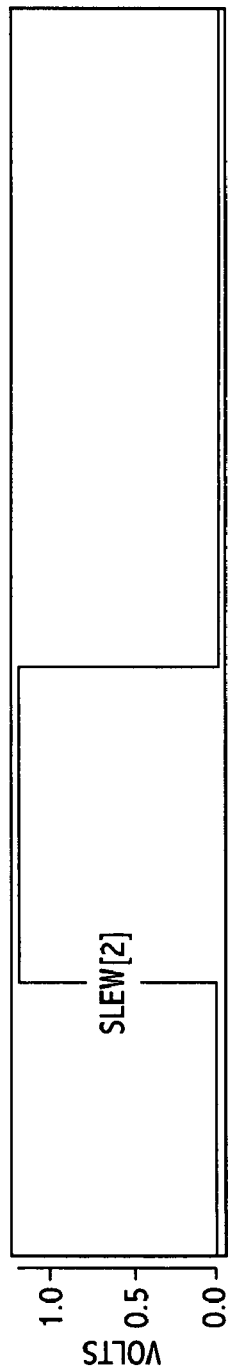
Figure 4C:
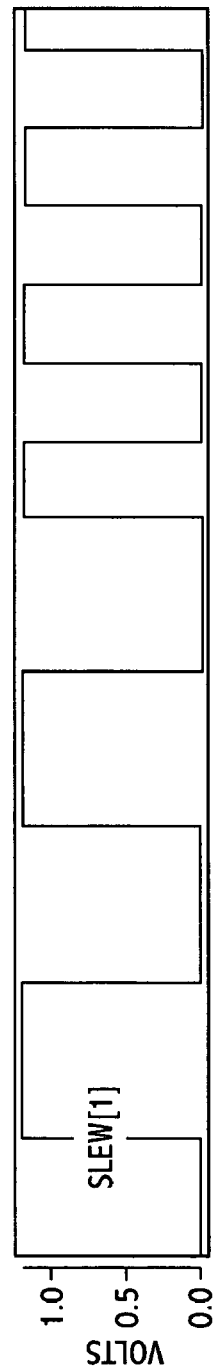
Figure 4D:
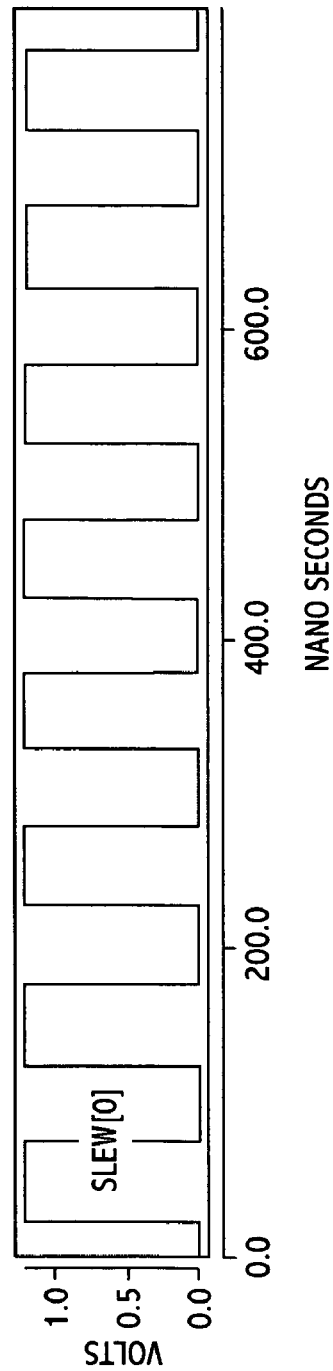

FIG. 3 shows functional blocks included in a method for controlling the rise and/or fall time of I/O driving signals in accordance with one embodiment of the present invention, which embodiment is preferably but not necessarily performed using the control circuit of FIG. 1.

Initially, a test pulse (or edge) is sent to the dummy buffer according to a predetermining timing. (Block 100). The test pulse may be output from a clock generator and the timing of the test pulse may be, for example, once every five bus clocks. For other applications, the timing may be different. Since the dummy buffer has a structure identical to the GTL buffer, the test pulse may correspond to the data input of the pre-driver discussed in greater detail below.

The rising/falling edge of the signal output to the pad is sampled at two predetermined voltage points. (Block 110). These points may correspond to 20% and 80% of the rising or falling edge respectively, or may correspond to one or more different points on the edge transition. A trade-off exists in selecting these points.

For example, the further the distance between them, the wider the pulse that is to be measured. This makes measurement more accurate. However, the high reference point must maintain some distance from the power rail in order for the sense amplifiers to operate correctly and prevent noise, and to avoid any glitches from overshoot and ring back on the pad. The points of 20% and 80% points may be preferred for many applications but are no means the only points that may be used.

The sampled values are sent to an XOR gate, which produces a time pulse having a duration at least substantially equal to the time δ between the two sampled points. (Block 120). This pulse is the time-shifted by passing it through the DLL-controlled delay line. (Block 130). The delay line shifts the pulse by an amount equal or proportional to an intended rise/fall time at the pad, e.g., as previously mentioned the target edge rate is the difference between the sense amplifier trip points divided by the delay line delay. For a 1-volt swing with 20% and 80% transition measurements and a 300 ps delay, the target slew rate will be (0.8 V–0.2 V)/(300 ps)=2 V/ns.

Phases of the time pulse and its time-shifted version are then compared, for example, using the phase detector. (Block 140). FIG. 2(*a*) shows an example of a pad signal 141 between high and low reference voltages, $V_{ref,\ high}$ and $V_{ref,\ low}$, corresponding to the sense amplifiers, and FIGS. 2(*b*) and 2(*c*) respectively show corresponding pulses 142 and 143 produced at points A and B along the first signal path of the delay circuit. Here, the pulse width (ΔT1) at least substantially equal to the time between the reference points and ΔT2 represents the delay programmed into the delay line. This time (or phase) shift between pulses A and B determines the adjustment in rise/fall time at the pad. While pulses A and B have substantially the same amplitude and duration, pulse B has a shape with more defined edges.

Based on the result of the comparison, a phase detection signal will be generated. (Block 150). A phase detection signal will be generated, for example, if the duration of the time pulse is or shorter than longer than the programmed delay of the delay line. If the duration of the time pulse equals the programmed delay of the delay line, then no phase detection signal is output and thus no adjustment is rise/fall time of the driving signal at the pad is required.

When a phase detection signal is generated, it is detected and a determination is made as to whether the intended delay (as programmed into the delay line) is shorter than the measured delay at the pad. If the rising edge of the delayed time pulse signal clocks the flip-flop of the phase detector while the un-delayed time pulse signal at the input of the flip-flop is still in the high state, the transition time of the driving signal at the pad is longer than the programmed delay in the delay line and therefore must be decreased. If the rising edge of the delayed time pulse signal clocks the flip-flop after the un-delayed signal transitions to a low state, the transition time of the driving signal at the pad is shorter than the programmed delay in the delay line, and therefore must be increased.

When either case arises, the phase detector outputs a signal to the demultiplexer. The demultiplexer then switches the signal to an appropriate one of the compensation circuits based on the selector signal, which, for example, corresponds to an inverted value of the test signal into the dummy buffer.

The compensation circuits for adjusting the rise and fall time measurements are preferably independent from one another, i.e., the rise and fall times at the pad are independently controlled to achieve an intended calibration at the pad. In FIG. 1, this independent control is effected by passing the output of the phase detector along one of two signal paths 71 and 72.

When the selection signal into the demultiplexer assumes a first value (e.g., corresponding one of a rising or falling edge of the test signal), the phase detection signal is output to counter 82 through filter 81. And, when the selection signal assumes a second value (e.g., corresponding to the other of the rising or falling edge of the test signal), the phase detection signal is output to counter 84 through filter 83.

Counter 82 increments or decrements the P-slew compensation bits into the dummy buffer, and counter 84 increments or decrements the N-slew compensation bits. (Block 160). These bits correspond to their respective count values. The counters increment or decrement these values based on the output of the filter, which in turn is based on the phase detector output. If four consecutive inputs to the filter are the same, the filter will enable the counter, and the counter will increment or decrement based on the value of those four inputs. A high value will tell the counter to increment; a low value will tell it to decrement.

The updated count value is used as a basis for generating one or more slew compensation bits into the dummy buffer. That is, once the compensation bits are updated they are clocked out to the dummy buffer as well as to all or a portion of the GTL buffers in the system. (Block 170). These buffers may reside on the same chip with the time control circuit or may be provided on different chips or boards. Counters 82 and 84 output the compensation bits to the GTL buffers through P- and N-slew bit generators 91 and 92 respectively, once a count update occurs.

After the compensation bits of the dummy buffer are updated, the test pulse is toggled and sent to the dummy buffer for the next measurement. More specifically, the slew bits control the pre-driver in the dummy and GTL buffers. That is, the pre-driver controls the rate of turn-on or turn-off of the n-pull down device, which in turn controls the transition rate on the pad. See above Thus, as previously discussed, the compensation bits control the pull-up and pull-down strengths of their pre-drivers.

FIGS. 4(*a*)–(*d*) are graphs showing examples of output signals from counter 84 generated during a simulation performed for generating the N-slew compensation bits of the pre-driver. These output signals are presented in a manner which reflects the results of phase detector. FIG. 4(*a*) shows that the counter was initialized to '0.' FIGS. 4(*b*)–(*d*) show that the counter continued to count up until the phase detector indicated that the transition time was too fast. Then, steady-state toggling was performed. This graphs therefore serve to show that full-loop compensation operates correctly, i.e., the counter initializes to '0' and the sense amplifiers, delay line, and phase detector work together to increment the counter until the transition at the pad matched the programmed delay of the delay line. Steady-state toggling was then entered into.

More specifically, the aforementioned graphs show the counter incrementing from 0 up to 9, and then steady stage toggling begins. Once FIGS. 4(*a*) and 4(*b*) settle out, it can be seen that FIGS. 4(*c*) and 4(*d*) continue to toggle in a repeating pattern, which corresponding to steady state toggling. The waveforms for the P-slew counter are comparable to FIGS. 4(*a*)–(*d*). The two counters are independent, in that both the rising and falling edge will compensate to the desired edge rate independently. The bit values for P-slew and N-slew may therefore be different at steady state.

For the conditions simulated, the N-slew bits were incremented to a value of 9, at which point the transition time at the pad was determined to be shorter than the delay line. The counter was therefore decremented to 8. In steady-state operation, the compensation bits may be toggled between two values. Therefore, in accordance with at least one embodiment the bits may be filtered before being sent to one or more GTL buffers. One filtering technique that may be used involves requiring a predetermined number (e.g., two) of consecutive up or down counts before updating the compensation bits. This will eliminate steady-state oscillation behavior at the GTL buffers.

Figure 5:
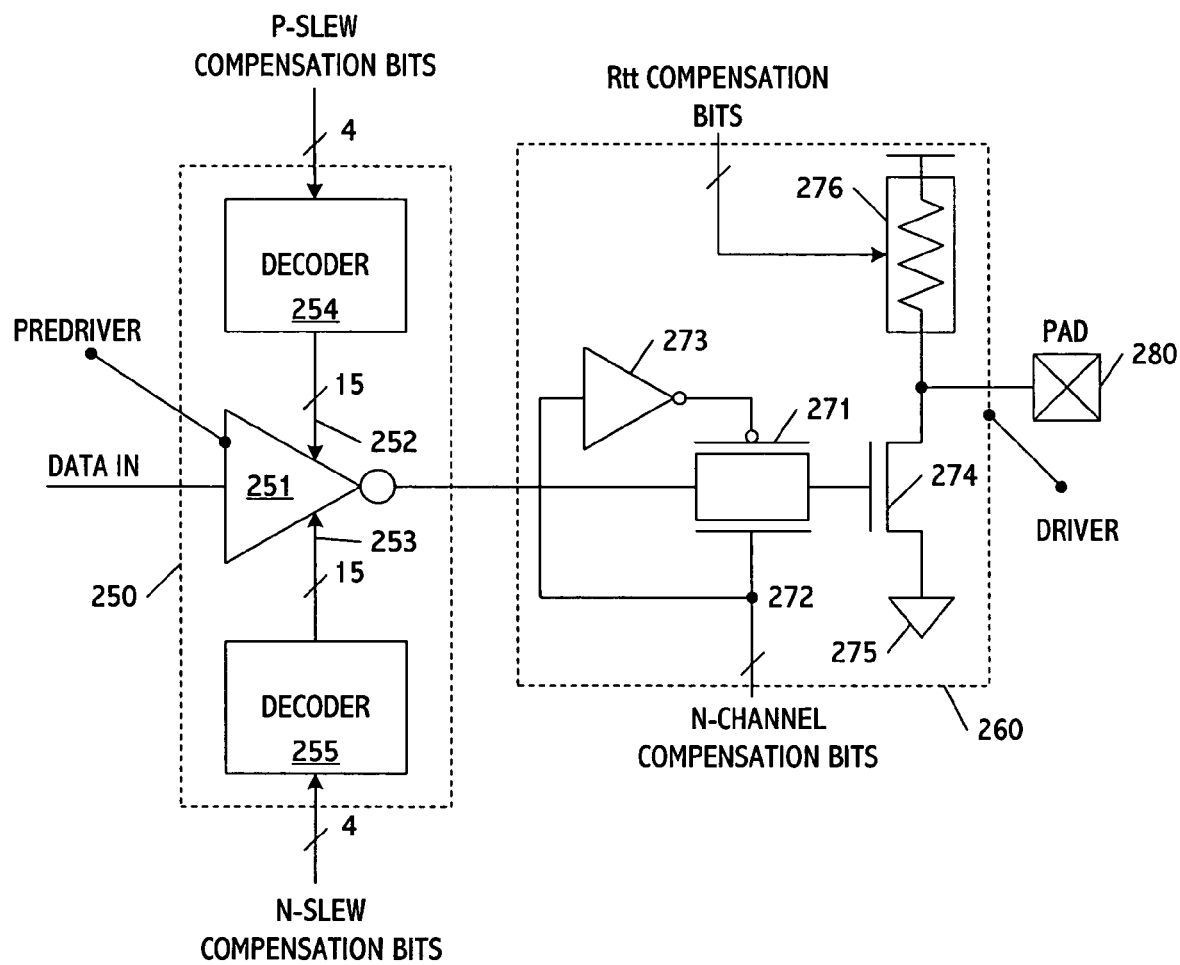
FIG. 5 is a diagram showing one type of GTL buffer that may be controlled by the slew compensation bits output from the control circuit of FIG. 1.

FIG. 5 shows one type of GTL buffer that may be controlled by the slew compensation bits output from the control circuit of FIG. 1. This buffer includes a pre-driver circuit 250 coupled to a driver circuit 260. The pre-driver circuit may be formed from an operational amplifier 251 with control inputs 252 and 253 respectively output from first and second decoder circuits 254 and 255. The first decoder decodes the P-slew compensation bits output from bit generator 91, and the second decoder decodes the N-slew compensation bits output from bit generator 92.

Each decoder transforms the slew compensation bits into a control voltage. In generating this voltage, the decoder essentially operates as a multiplexer. That is, the decoder takes the binary encoded outputs from the counter and converts them to thermometer coding. In this illustrative embodiment, the pre-driver has 15 controllable legs. Given this configuration, decoding may be performed as follows:

| Encoded bits | Decoded bits |
|---|---|
| 0000 | 000 0000 0000 0000 |
| 0001 | 000 0000 0000 0001 |
| 0010 | 000 0000 0000 0011 |
| 0011 | 000 0000 0000 0111 |
| 0100 | 000 0000 0000 1111 |
| 0101 | 000 0000 0001 1111 |
| 0110 | 000 0000 0011 1111 |
| 0111 | 000 0000 0111 1111 |
| 1000 | 000 0000 1111 1111 |
| 1001 | 000 0001 1111 1111 |
| 1010 | 000 0011 1111 1111 |
| 1011 | 000 0111 1111 1111 |
| 1100 | 000 1111 1111 1111 |
| 1101 | 001 1111 1111 1111 |
| 1110 | 011 1111 1111 1111 |
| 1111 | 111 1111 1111 1111 |

The decoded bits control the strength of the pre-driver, but do not control any amplifier. The more legs that are enabled, the bigger the effective devices and the stronger the drive strength. This will turn on or turn off the n-pull down device more strongly. That, in turn, will affect the transition time of the signal at the pad.

The driver circuit includes a pass gate formed from drain-to-drain, source-to-source coupled transistors 271 and 272, an inverter 273, a transistor 274 coupled to a reference potential (e.g., ground) 275, and a resistive element 276. Transistor 274 is the n-channel pull down transistor that causes a falling edge to appear on the pad. This pull-down device may alternatively be formed from several devices in parallel which are enabled by a different compensation circuit (not shown) that controls the strength of the device. The pre-driver controls how strongly or weakly this device is turned on. A separate compensation loop controls the N-channel bits. These bits control the strength of the N-channel, whereas the pre-driver controls how quickly it turns on or off.

In operation, N-channel compensation bits are input into the gates of the pass-gate transistors. These bits are translated into voltages which cause the pass gate to input the pre-driver output into the gate of transistor 275. If the pre-driver output activates this transistor, the pad 280 is connected to ground or a predetermined reference voltage. If the pre-driver output does not activate transistor 275, the pad voltage is controlled by the value output from the resistive element. This value is controlled by Rtt compensation bits, which are explained in greater detail below.

In order to minimize reflections on signals, the signals must terminate with a matched impedance. This termination resistance is called "Rtt". In modern microprocessors, the termination resistance is implemented on a CPU die (or on the chipset die at the other end of the signal). Since the absolute tolerance of components on semiconductor technologies is not very precise, a compensation state machine (not shown) may be used to compensate for process, voltage, and temperature variations changes impact upon the Rtt devices. These state machines are known.

The value of the voltage output to the pad may be determined as follows. The Voh and Vol levels at the pad are determined by the strength of the Rtt and N-channel pull-down. When a '1' is driven on the pad, the N-pull down is off, the Rtt pulls the pad voltage to Vtt. So, Voh= Vtt. When a '0' is driven on the pad, the N-pull down is on, and pulls against the Rtt. The target Rtt value is 60 ohms, and the target N-channel value is 10 ohms. The motherboard has a 60 ohm resistor tied to this pad, so there is an equivalent 30 ohm resistance to Vtt. As a result, 30 ohms goes to Vtt and 10 ohms goes to Vss when driving a low. Vol=0.25*Vtt. (FIG. 5 is a generic description of an output buffer. A copy of this buffer is implemented in the RFTC, and in this case pad 280 would be the same as pad 10 in FIG. 1. Each I/O may have a similar circuit attached to a pad, but those other cells will have different pads.)

Figure 6:
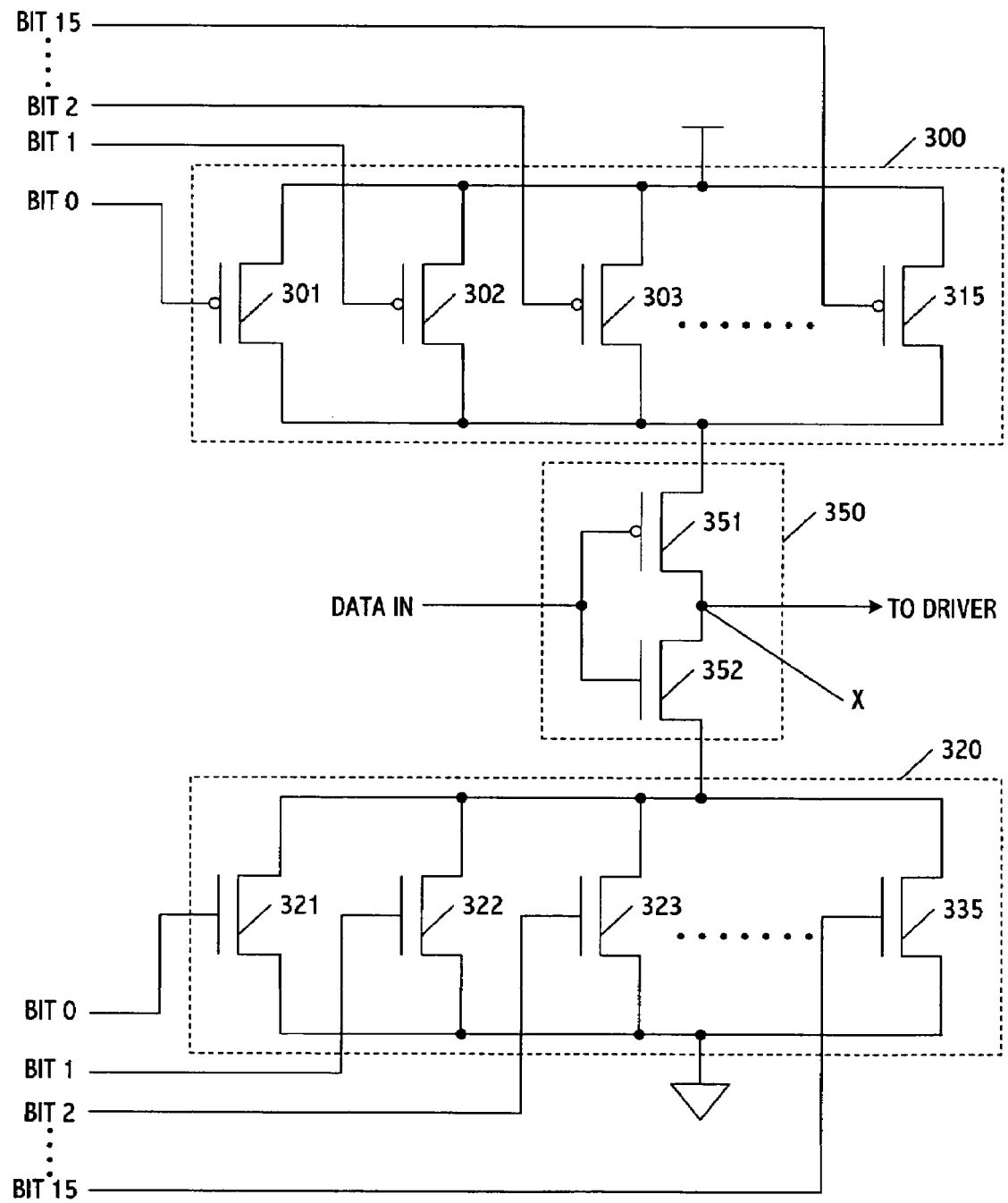
FIG. 6 is a diagram showing an example of a pre-driver circuit that may be used in the GTL buffer of FIG. 2.

FIG. 6 shows an example of a pre-driver circuit that may be used in the GTL buffer of FIG. 2. This circuit includes an array 300 of N-channel pull-up devices 301–315 and an array 320 of P-channel pull-down devices 321–335. The arrays are connected to a circuit 350, which includes a P-channel transistor 351 and an N-channel transistor 352. The number of pull-up/pull-down devices in the arrays preferably equals the number of P-slew and N-slew compensation bits respectively. The gates of transistors 351 and 352 are connected to the data input terminal and a node X between these transistors is connected to the pass-gate of the driver circuit.

In operation, the slew compensation bits control the RC time constant between the driver and pre-driver of the GTL buffer. More specifically, when P-slew compensation bits are received, bits having a logical zero value turn on a respective number of pull-up transistors, thereby controlling the value output to the driver. (Pull-up is accomplished based on a supply voltage 380 connected to sources of the P-channel transistors). When the N-slew compensation bits are received, bits having a logical one value turn on a respectively number of pull-down transistors, thereby controlling the value output to the driver. (Pull-down is accomplished based on a reference voltage (e.g., ground) 390 connected to drains of the N-channel transistors). Controlling the RC time constant in this manner adjusts the rise/fall times at the pad, by controlling the turn-on and turn-off rate of the N-channel pull0down devices.

Figure 7:
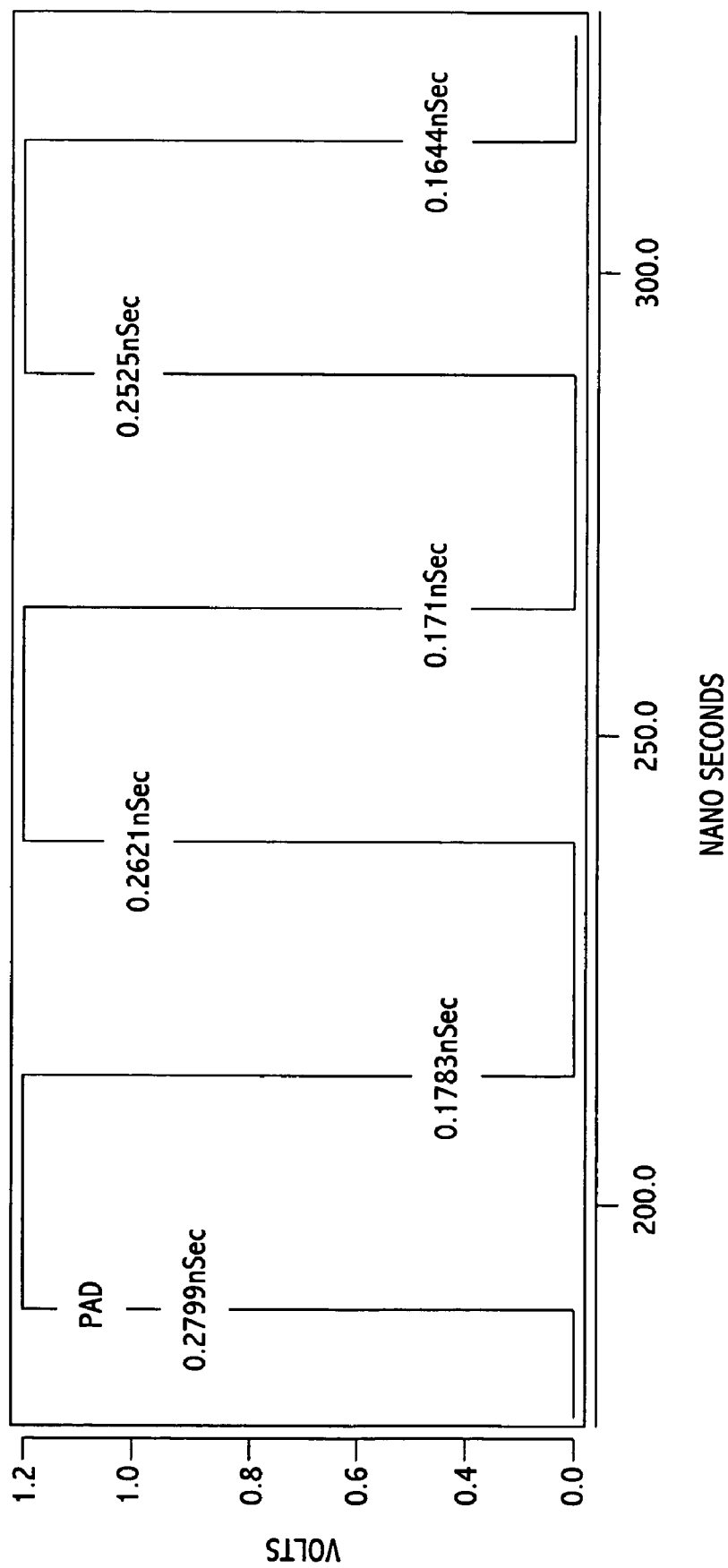
FIG. 7 shows the rise/fall times that were generated at the pad for compensating the pre-driver during a simulation of the control circuit of FIG. 1.

FIG. 7. is a graph showing results obtained for a simulation of the rise/fall time compensation circuit. Here, the target rise/fall time is faster than the pulses shown in the graph. It can be seen that as the compensation machine measures the edge and responds, the edge rates are affected. The rise time of the first pulse is shown as 280 ps. This is slower than the target delay, and the compensation machine increments the counter. This strengthens the pre-driver, which turns on/off the n-pulldown more quickly, and results in the faster rise time on the next pulse of 262 ps. This rise time is still slower than targeted, and the compensation machine again updates the rise time to produce the rise time of 253 ps on the third rising edge. This behavior will continue until the rise time matches the targeted rise time as programmed in the delay line. The falling edges are compensated in the same manner.

Figure 8:
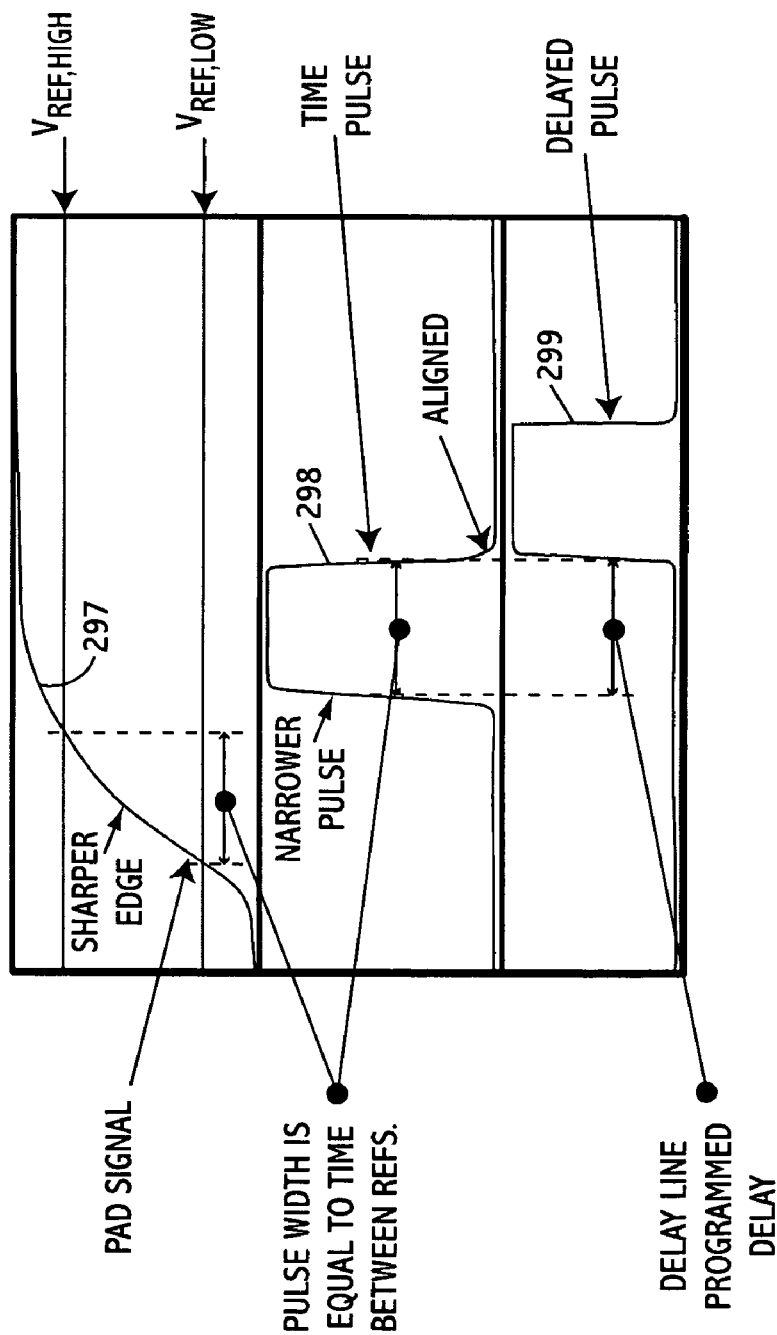
FIG. 8 shows a processing system which may include a control circuit in accordance with any of the embodiments of the present invention.

FIG. 8(*a*) is a graph showing a pad signal 297 between high and low reference voltages, $V_{ref,\ high}$ and $V_{ref,\ low}$, corresponding to the sense amplifiers of the FIG. 1 circuit, and FIGS. 8(*b*) and 8(*c*) respectively show corresponding pulses 298 and 299 produced along the first signal path of the delay circuit in this figure. Graph 8(*c*) shows a relationship that exists after rise/fall time correction in accordance with one embodiment of the invention, e.g., in this graph the temporal or phase difference between rising edge of the delayed time pulse and the fall edge of the time pulse has been reduced.

To achieve optimal results, this difference is preferably reduced to zero. Under these conditions, the duration (or phase) of the time pulse has been adjusted to at least substantially equal the delay time programmed into the delay line (or the phase of the time-delayed signal). Put differently, by way of comparison to FIGS. 3(b) and 3(c), in one type of uncorrected state waveforms A and B overlap, indicating that the pad edge rate (the top waveform) is slower than desired. As shown in FIGS. 8(b) and (c), in a corrected state the falling edge of A aligns with the rising edge of B, indicating that the pad edge rate is equal to the target. Thus, by aligning these phases, a rise and/or fall time of the driving signal at the pad is corrected to a value based on the programmed delay in the delay line.

When this occurs, the transition time (e.g., the rise and/or fall time) of the driving signal at the pad may be considered to be corrected to an intended value.

Figure 9:
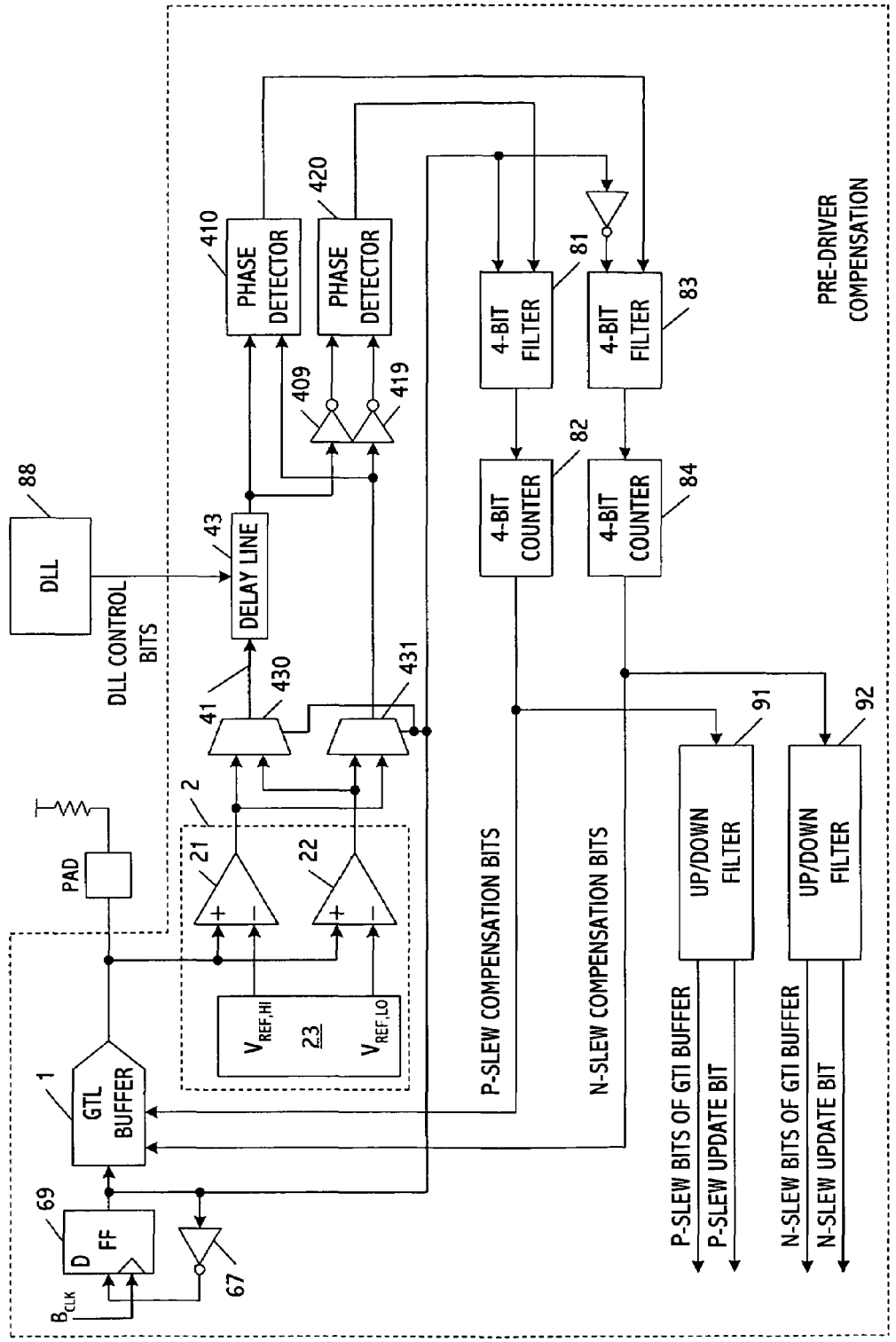
FIG. 9 shows a circuit for controlling the rise and/or fall time of driving signals in accordance with another embodiment of the present invention.

FIG. 9 shows a circuit for controlling the rise and/or fall time of driving signals in accordance with another embodiment of the present invention. Like in the previous embodiment, the driving signals may be any type including but not limited to I/O signals traveling between a CPU and chipset on the motherboard of a computer or other processing system, or ones traveling along chipset/DRAM connections.

The control circuit of this embodiment is similar to the embodiment of FIG. 1 (and thus like reference numerals have been used where applicable) except that the XOR gate and demultiplexer are removed and the outputs of the sense amplifiers are coupled along signal paths that lead to phase detectors 410 and 420. More specifically, phase detector 410 compares the difference in phase between the delayed signal output from delay line 43 and the signal output from multiplexer 431, which is coupled to the output of sense amplifiers 21 and 22. Phase detector 420 compares the difference in phase between the delayed signal output from delay line 43 and the signal output from multiplexer 431, but only after these two signals have been passed through inverters 409 and 419 respectively. The output of the phase detectors are then separately connected to respective counters through corresponding n-tap filters, in order to independently control the rise and fall times of the driving signals at the pad in the same manner as previously described.

Unlike in the previous embodiment, this embodiment of the present invention does not create a time pulse but rather compares the outputs of the sense amplifiers directly. More specifically, in this embodiment the XOR gate simply converts the time difference from the sense amplifier outputs into a pulse, e.g., instead of creating a pulse and then measuring it the time difference between the sense amplifier outputs is simply measured.

On a rising edge at the pad, the sense amplifier with the low reference ($V_{REF, lo}$) will trip first. The output of this amplifier will then be delayed and compared to the high reference amplifier ($V_{REF, Hi}$) output. If the programmed delay is shorter than the time difference, the delayed low reference signal will arrive before the high reference signal, which serves as the clock to the phase detector.

If the phase detector captures a high, it means that the programmed delay was shorter than the actual measured delay. Therefore, a high value out of the phase detector means the pre-driver must get stronger, i.e., increment. If the phase detector captures a low, it means the delayed signal arrived after the high reference, and the pad transition was longer than the programmed delay. In this case, the low value out of the phase detector implies that the counter needs to decrement.

The above-described operation works for the rising edge at the pad. For the falling edge, the order in which the sense amplifier trips will be reversed, e.g., the high reference sense amplifier will trip first. Preferably, multiplexers 430 and 431 are respectively provided at the outputs of the sense amplifiers which control which sense amplifier output is delayed based on the output of flip-flop 69. In the case of a falling edge, the signals may be inverted before being sent to the phase detector so that the polarity is the same.

Figure 10:
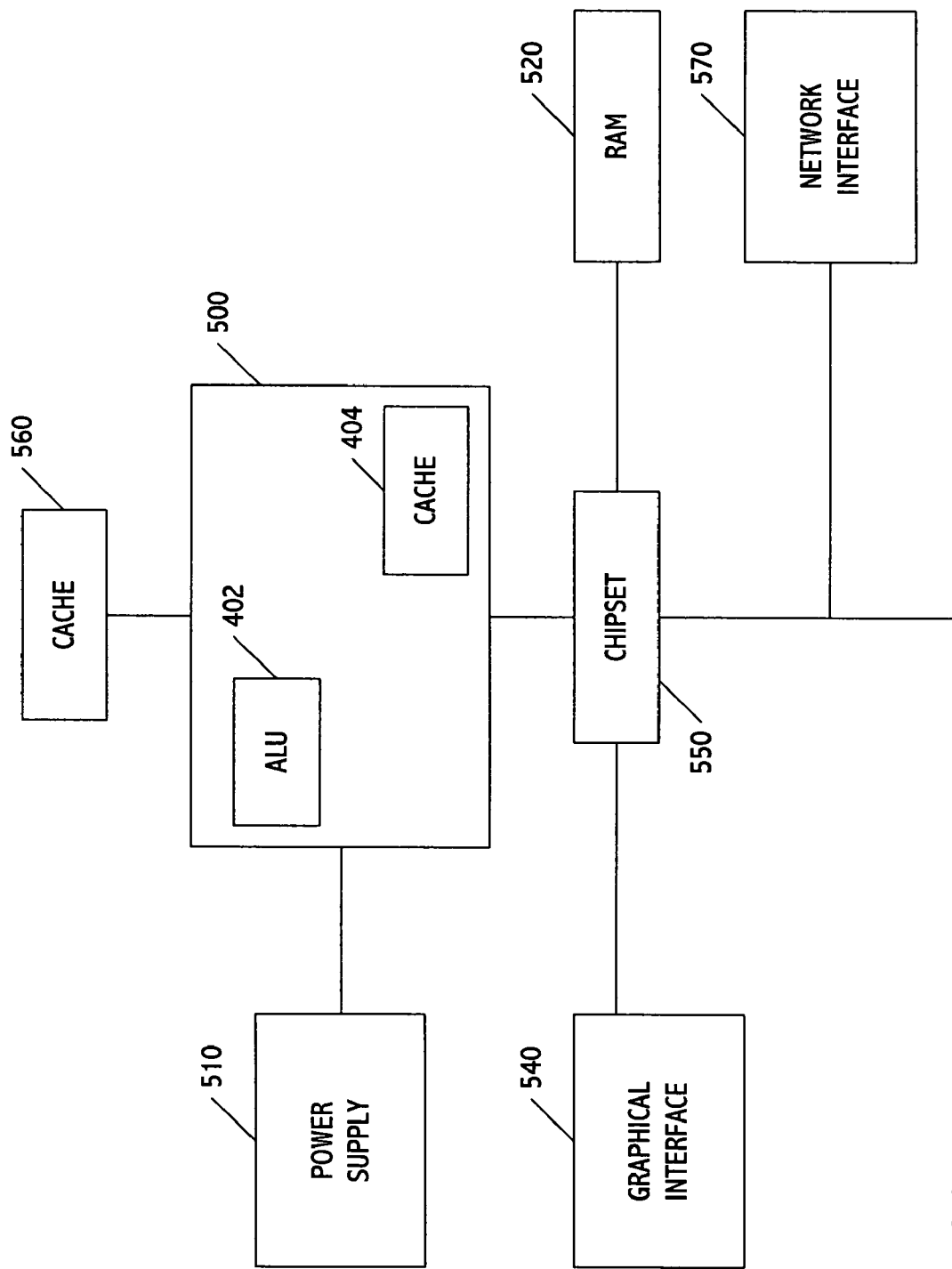
FIG. 10 shows an embodiment of a processing system according to the present invention.

FIG. 10 shows a processing system which includes a processor 500, a power supply 510, and a memory 520 which, for example, may be a random-access memory. The processor includes an arithmetic logic unit 502 and an internal cache 504. The system also preferably includes a graphical interface 540, a chipset 550, a cache 560, and a network interface 570. The processor may be a microprocessor or any other type of processor. If the processor is a microprocessor, it may be included on a chip die with all or any combination of the remaining features, or one or more of the remaining features may be electrically coupled to the microprocessor die through known connections and interfaces.

In FIG. 10, one or more embodiments of the present invention may be implemented in block 500 to, for example, control the rise or fall time of the I/O signals generated therefrom. The results would produced enhanced performance in terms of maximum operating frequency on the bus between block 500 and block 550, the chipset.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A correction circuit, comprising:
   a generator to generate a time pulse from a driving signal;
   a delay circuit to delay the time pulse by a predetermined time;
   a comparator to compare phases of the time pulse and the delayed time pulse; and
   a controller to reduce a difference between the phases of the time pulse and the delayed time pulse based on a result of the comparison, wherein the predetermined delay time corresponds to a desired rise/fall time of the driving signal.

2. The circuit of claim 1, wherein the controller reduces said difference by adjusting the phase of the time pulse.

3. The circuit of claim 2, wherein the controller adjusts the phase of the time pulse so that an edge of the time pulse at least substantially coincides with an edge of the delayed time pulse.

4. The circuit of claim 3, wherein the controller adjusts the phase of the time pulse so that a falling edge of the time pulse at least substantially coincides with a rising edge of the delayed time pulse.

5. The circuit of claim 1, wherein the controller generates correction bits for independently controlling at least one of a rise time and fall time of the driving signal based on a signal output from the comparator.

6. The circuit of claim 1, wherein the controller shortens a duration of the time pulse when the comparison result indicates that the time pulse and the delayed time pulse are in a same state.

7. The circuit of claim 6, wherein the controller generates a signal to adjust a strength of a pre-driver circuit to shorten the duration of the time pulse, said pre-driver circuit generating the driving signal.

8. The circuit of claim 1, wherein the controller lengths the duration of the time pulse when the comparison result indicates that the delayed time pulse has a rising edge that occurs after a falling edge of the time pulse.

9. The circuit of claim 8, wherein the controller generates a signal to adjust a strength of a pre-driver circuit to lengthen the duration of the time pulse, said pre-driver circuit generating the driving signal.

10. The circuit of claim 1, further comprising:
a delay-locked loop circuit to set the delay circuit to the predetermined time.

11. A correction circuit, comprising:
a sampler to generate multiple samples from a driving signal;
a delay circuit to delay a first sampled signal by a predetermined time;
a comparator to compare the first delayed sampled signal to a second sampled signal; and
a controller to align the first delayed sampled signal and the second sampled signal based on a result of the comparison.

12. The circuit of claim 11, wherein the predetermined time corresponds to a desired rise/fall time of the driving signal.

13. The circuit of claim 11, wherein the comparator includes:
at lease one first phase detector to compare phases of the first delayed sampled signal and the second sampled signal, wherein the controller aligns the first delayed sampled signal and the second sampled signal based on a phase difference measured by the phase detector.

14. The circuit of claim 11, wherein the comparator includes:
a first phase detector to compare phases of the first delayed sampled signal and the second sampled signal,
a first inverter to invert the first delayed sampled signal;
a second inverter to invert the second sampled signal; and
a second phase detector to compare phases of the inverted first delayed sampled signal and the inverted second sampled signal, wherein the controller aligns the first delayed sampled signal and the second sampled signal based on a phase difference measured by one of the first and second phase detectors.

15. The circuit of claim 11, wherein the controller generates correction bits for independently controlling at least one of a rise time and fall time of the driving signal based on a signal output from the comparator.

16. A signal processing method, comprising:
generating a time pulse from a driving signal;
delaying the time pulse by a predetermined time;
comparing phases of the time pulse and the delayed time pulse; and
reducing a difference between the phases of the time pulse and the delayed time pulse based on a result of the comparison, wherein the predetermined delay time corresponds to a desired rise/fall time of the driving signal.

17. The method of claim 16, wherein the difference is reduced by adjusting the phase of the time pulse.

18. The method of claim 17, wherein the phase of the time pulse is adjusted so that an edge of the time pulse at least substantially coincides with an edge of the delayed time pulse.

19. The method of claim 18, wherein the phase of the time pulse is adjusted so that a falling edge of the time pulse at least substantially coincides with a rising edge of the delayed time pulse.

20. The method of claim 16, wherein reducing the difference includes:
generating correction bits for independently controlling at least one of a rise time and fall time of the driving signal based on the comparison result.

21. The method of claim 16, wherein reducing the difference includes:
shortening a duration of the time pulse when the comparison result indicates that the time pulse and the delayed time pulse are in a same state.

22. The method of claim 21, wherein shortening the duration includes:
generating a signal to adjust a strength of a pre-driver circuit to shorten the duration of the time pulse, said pre-driver circuit generating the driving signal.

23. The method of claim 16, wherein reducing the difference includes:
lengthening the duration of the time pulse when the comparison result indicates that the delayed time pulse has a rising edge that occurs after a falling edge of the time pulse.

24. The method of claim 23, wherein lengthening the duration includes:
generating a signal to adjust a strength of a pre-driver circuit to lengthen the duration of the time pulse, said pre-driver circuit generating the driving signal.

25. A signal processing method, comprising:
generating multiple samples from a driving signal;
delaying a first sampled signal by a predetermined time;
comparing the first delayed sampled signal to a second sampled signal; and
aligning the first delayed sampled signal and the second sampled signal based on a result of the comparison.

26. The method of claim 25, wherein the predetermined time corresponds to a desired rise/fall time of the driving signal.

27. The method of claim 25, wherein comparing includes:
comparing phases of the first delayed sampled signal and the second sampled signal,
wherein the first delayed sampled signal and the second sampled signal are aligned based on a phase difference measured by the phase detector.

28. The method of claim 25, wherein aligning includes:
generating correction bits for independently aligning at least one of a rise time and fall time of the driving signal based on the comparison result.

29. A system, comprising:
a first circuit; and
a second circuit having a correction circuit which includes:
(a) a generator to generate a time pulse from a driving signal;
(b) a delay circuit to delay the time pulse by a predetermined time;
(c) a comparator to compare phases of the time pulse and delayed time pulse; and
(d) a controller to reduce a difference between the phases of the time pulse and the delayed time pulse based on a result of the comparison, wherein the predetermined delay time corresponds to a desired rise/fall time of the driving signal.

30. The system of claim 29, wherein the controller reduces said difference by adjusting the duration of the time pulse.

31. The system of claim 29, wherein the controller generates correction bits for independently controlling a rise time and fall time of the driving signal based on a signal output from the comparator.

32. The system of claim 29, wherein the first and second circuits are selected from the group consisting of a central processing unit (CPU) and a chipset.

33. The system of claim 32, wherein the CPU and chipset are located on a same motherboard of a computer.

34. The system of claim 29, wherein the first and second circuits are selected from the group consisting of a chipset and a memory circuit.

* * * * *